(12) United States Patent
Lee et al.

(10) Patent No.: US 8,415,259 B2
(45) Date of Patent: *Apr. 9, 2013

(54) METHOD OF DEPOSITING DIELECTRIC FILM BY MODIFIED PEALD METHOD

(75) Inventors: Woo Jin Lee, Kyounggi-Do (KR); Kuo-Wei Hong, Tama (JP); Akira Shimizu, Kai (JP); Daekyun Jeong, Seoul (KR)

(73) Assignee: ASM Japan K.K., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/410,970

(22) Filed: Mar. 2, 2012

(65) Prior Publication Data

US 2012/0220139 A1    Aug. 30, 2012

Related U.S. Application Data

(63) Continuation-in-part of application No. 12/901,323, filed on Oct. 8, 2010, now Pat. No. 8,173, 554.

(60) Provisional application No. 61/251,526, filed on Oct. 14, 2009.

(51) Int. Cl.
*H01L 21/31* (2006.01)

(52) U.S. Cl.
USPC .................................. 438/792; 257/E21.24

(58) Field of Classification Search ........................ None
See application file for complete search history.

(56) References Cited

U.S. PATENT DOCUMENTS

| | | | |
|---|---|---|---|
| 6,756,318 B2 | 6/2004 | Nguyen et al. | |
| 7,153,542 B2 * | 12/2006 | Nguyen et al. | 427/248.1 |
| 7,163,721 B2 | 1/2007 | Zhang et al. | |
| 7,498,242 B2 | 3/2009 | Kumar et al. | |
| 7,727,864 B2 | 6/2010 | Elers | |
| 2003/0040158 A1 | 2/2003 | Saitoh et al. | |
| 2008/0113094 A1 | 5/2008 | Casper | |
| 2009/0286402 A1 | 11/2009 | Xia et al. | |
| 2010/0124621 A1 | 5/2010 | Kobayashi et al. | |

OTHER PUBLICATIONS

Notice of Allowance dated Jan. 9, 2012 for U.S. Appl. No. 12/901,323.

* cited by examiner

*Primary Examiner* — Seahvosh Nikmanesh
(74) *Attorney, Agent, or Firm* — Snell & Wilmer L.L.P.

(57) ABSTRACT

A method of forming a film on a semiconductor substrate by plasma enhanced atomic layer deposition (PEALD), includes: introducing a nitrogen- and hydrogen-containing reactive gas and a rare gas into a reaction space inside which the semiconductor substrate is placed; introducing a precursor in pulses of less than 1.0-second duration into the reaction space wherein the reactive gas and the rare gas are introduced; exiting a plasma in pulses of less than 1.0-second duration immediately after the precursor is shut off; and maintaining the reactive gas and the rare gas as a purge of less than 2.0-second duration.

20 Claims, 11 Drawing Sheets

METHOD OF DEPOSITING DIELECTRIC FILM BY MODIFIED PEALD METHOD

CROSS-REFERENCE TO RELATED APPLICATIONS

This application is a continuation-in-part of U.S. patent application Ser. No. 12/901,323, filed Oct. 8, 2010, which claims the benefit of U.S. Provisional Application No. 61/251,526, filed Oct. 14, 2009, each disclosure of which is herein incorporated by reference in its entirety.

BACKGROUND

1. Field of the Invention

The present invention relates to semiconductor integrated circuit manufacturing and, more particularly to a method of depositing the silicon nitride films using modified plasma enhanced atomic layer deposition (PEALD) at low temperatures (under 600° C., particularly under 400° C.).

2. Description of the Related Art

Silicon nitride layers deposited at low temperatures (under 600° C., particularly under 400° C.) have been used in a number of important applications for memory devices, for example, as a passivation layer, a surface protection layer, and/or a spacer for a transistor gate. Silicon nitride films may be formed by plasma enhanced chemical vapor deposition (PECVD) methods. The main advantages of the PECVD methods over other CVD methods are higher deposition rates and controllability over refractive indices in a wide range. A further advantage of the PECVD methods is that the process can take place at a relatively low temperature, for example, at temperatures under 600° C., particularly under 400° C., keeping minimum the total thermal budget of the cell processing. However, the PECVD methods for forming silicon nitride lead to poor conformality or poor step coverage on a substrate containing small features. In a small circuits and devises such as ultra-large scale integrated (ULSI) circuitries, such poor conformal coverage hampers the development of higher density circuit devices and elements.

In recent years, atomic layer deposition (ALD) and plasma enhanced atomic layer deposition (PEALD) methods have been investigated to improve conformality or step coverage of silicon nitride films on a substrate containing small features. However, the ALD or PEALD methods for forming silicon nitride lead to extremely poor deposition rates. Such poor deposition rates hamper lowering the manufacturing cost for development of higher density circuit devices and elements.

SUMMARY

Embodiments of the present invention provide a method of forming thin films using modified plasma enhanced atomic layer deposition (PEALD) at low temperatures (under 600° C., particularly under 400° C.) at high deposition rates with high conformality (e.g., at least 90%). Furthermore, the present invention provides a method for modifying etch properties (such as etching rate) of the deposited layers by adding a second precursor while maintaining a high deposition rate and high conformality.

Accordingly, in an aspect, an object of at least one embodiment of the present invention is to provide a method of forming a highly conformal (e.g., at least 90%, in some embodiments, no less than 95%) layer, such as a layer of silicon nitride, on surfaces of trenches for an integrated circuit at low temperatures (e.g., <400° C.), and as explained below, one or more of the disclosed embodiments effectively accomplish at least the object.

In some embodiments, a method of forming a highly conformal layer on a semiconductor substrate by modified plasma enhanced atomic layer deposition (PEALD) comprises: introducing a reactive gas and an rare gas into a CVD reaction chamber inside which a semiconductor substrate is placed wherein the semiconductor substrate temperature is maintained in a range of approximately 0° C. to approximately 400° C.; after the gases are introduced into the reaction chamber, introducing a precursor into the reaction chamber in pulses using a pulse flow control valve, for example, wherein the precursor is introduced into the reaction chamber where the plasma is not excited; providing a plasma exciting condition in the reaction chamber immediately (e.g., 0~0.1 sec) after the precursor is shut off; maintaining the introduction of the reactive gas and an rare gas as a purge for a 2-second or less duration after the plasma excitation is ended; and continuously repeating the above steps, such as the introduction of a precursor in pulses, the plasma excitation, and the purging, thereby forming a hydrogen-containing conformal film on the substrate having a target thickness.

In some embodiments, the substrate is maintained at a temperature of about 0° C. to 400° C. The precursor may be composed of a combination of silicon and hydrogen, a combination of silicon, hydrogen, and nitrogen, or a combination of silicon, hydrogen, carbon, and nitrogen. In some embodiments, the vaporized precursor may be introduced in pulses of duration of approximately 0.1 sec to approximately 1.0 sec. After introducing the precursor, a plasma may be exited in pulses of duration of approximately 0.1 sec to approximately 1.0 sec and then an interval step is carried out using the reactive gas for approximately 0.1 sec to approximately 1.0 sec without introducing the precursor and without the existing of plasma. In some embodiments, the reaction gas may be a combination of nitrogen gas and hydrogen gas or a combination of ammonia gas and hydrogen gas. In some embodiments, the rare gas may be selected from the group consisting of He, Ar, Kr, Xe, and the molar flow rate of the rare gas may be greater than the molar flow rate of the precursor. In some embodiments, the reaction chamber may be maintained at a pressure of about 0.1 Torr to about 10 Torr. In some embodiments, RF power may be between approximately 0.02 W/cm$^2$ and approximately 2.0 W/cm$^2$.

In another aspect, an object of at least one embodiment of the present invention is to provide a method for modifying etch properties of a layer, such as a layer of silicon nitride, which has a high conformal (step coverage 90% or higher, in some embodiments, no less than 95%) layer on surfaces of trenches for an integrated circuit at low temperatures (e.g., <600° C.), and as explained below, one or more of the disclosed embodiments effectively accomplish at least the object.

In some embodiments, a method for modifying etch properties of a layer at a high conformality on a semiconductor substrate by modified plasma enhanced atomic layer deposition (PEALD) comprises: introducing a reactive gas and a rare gases into a CVD reaction chamber inside which a semiconductor substrate is placed wherein the semiconductor substrate temperature is maintained in a range of approximately 0° C. to approximately 600° C.; after the gases are introduced into the reaction chamber, introducing a carbon-free silicon precursor and a second precursor into the reaction chamber in pulses using a pulse flow control valve, for example, wherein the carbon-free silicon precursor and the second precursor are introduced into the reaction chamber where the plasma is not excited; providing a plasma exciting condition in the reaction chamber immediately (e.g., 0~0.1 sec) after the carbon-free silicon precursor and the second precursor are shut off; maintaining the introduction of the reactive gas and an rare gas as a purge for a 2-second or less duration; and continuously repeating the above steps, such as the introduction of the carbon-free silicon precursor and the second precursor in pulses, the existing of plasma, and the purging, thereby forming an etch property-turned conformal film on the substrate having a target thickness.

In some embodiments, the substrate is maintained at a temperature of about 0° C. to 600° C. A carbon-free silicon precursor may be composed of a combination of silicon and hydrogen, or a combination of silicon, hydrogen, and nitrogen. In some embodiments, the vaporized carbon-free silicon precursor and the second precursor may be introduced in pulses of a duration of approximately 0.1 sec to approximately 1.0 sec. A plasma may be exited in pulses of a duration of approximately 0.1 sec to approximately 1.0 sec immediately (e.g., 0~0.1 sec) after the carbon-free silicon precursor and the second precursor are shut off and then an interval step is carried out using the reactive gas and the rare gas for approximately 0.1 sec to approximately 1.0 sec without introducing the Si-containing precursor and without the existing of plasma. In some embodiments, the reaction gas may be a combination of nitrogen gas and hydrogen gas. In some embodiments, the second precursor may be $NH_3$ or $C_xH_y$, or hydrocarbon containing silicon precursor, where x and y is integers. In some embodiments, x may be 1 to 8 and y may be 4 to 18. In some embodiments, the reaction chamber may be maintained at a pressure of about 0.1 Torr to about 10 Torr. In some embodiments, RF power may be between approximately 0.02 W/cm$^2$ and approximately 2.0 W/cm$^2$.

In this disclosure, the "gas" includes vaporized solid and/or liquid, and may be comprised of a mixture of gases. In this disclosure, the "precursor" may be in form of vaporized solid and/or liquid.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are oversimplified for illustrative purpose and are not necessarily to scale.

DETAILED DESCRIPTION

Figure 1:
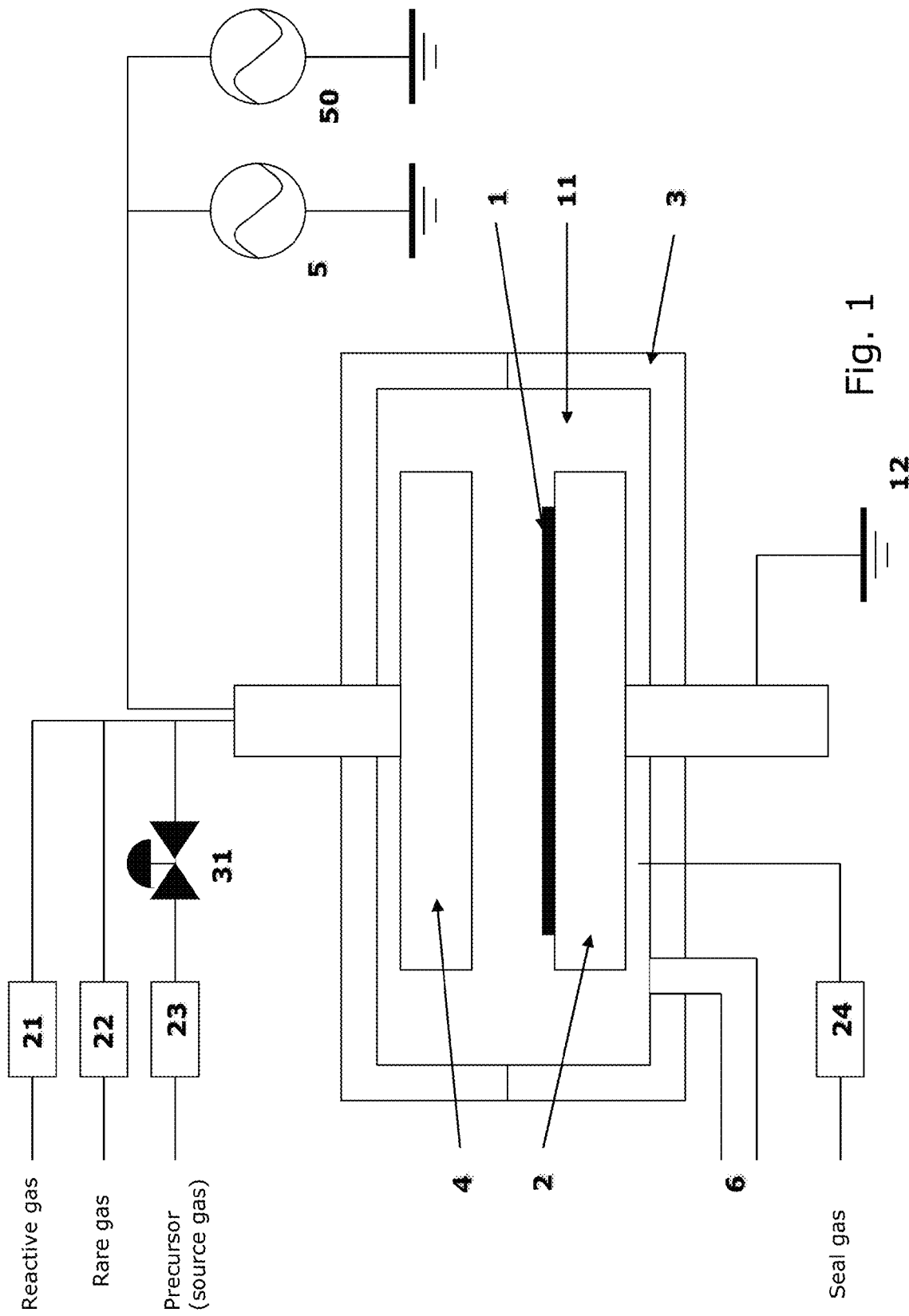
FIG. 1 is a schematic representation of a PEALD apparatus for depositing a dielectric layer having Si—N bonds according to some embodiments of the present invention.

The present invention is described with reference to embodiments which are not intended to limit the present invention. Among some embodiments, a feature or features may interchangeably or additionally be applied unless special conditions are attached thereto. Further, the ranges indicated below may include or exclude the endpoints in embodiments.

As described in this disclosure, in some embodiments of the present invention, the disclosed methods effectively increase film growth rates, and a skilled artisan will appreciate that the methods are applicable to deposition of not only silicon nitride films but also other types of film (e.g., other silicon-containing films such as silicon carbide films, silicon oxide films, etc.), wherein the improvements can readily be achieved by modifications made to deposition processes according to the types of film in a manner that is described in this disclosure. A skilled artisan can readily provide conditions for deposition of each type of film in view of the present disclosure, as a matter of routine experimentation. According to some embodiments of the present invention, the growth rate and conformality of films including dielectric films and other films, using silicon or non-silicon precursors, can surprisingly be improved as compared to those achieved by conventional PECVD methods. The disclosed embodiments of the present invention will be explained with reference to typical examples which involve silicon nitride for illustrative purposes, rather than for limiting the present invention. The disclosed embodiments are applicable to other types of film as a skilled artisan understands in view of the present disclosure.

The disclosed embodiments include a method of forming a dielectric film having Si—N bonds on a semiconductor substrate by plasma enhanced atomic layer deposition (PEALD), which comprises: (a) selecting a combination of gases for forming a dielectric film having Si—N bonds by PEALD, said gases comprising a reactive gas, a rare gas, and a Si-containing precursor, which are different from each other; (b) continuously introducing the reactive gas and a the rare gas without interruption into a reaction space inside which the semiconductor substrate is placed; (c) introducing the precursor in pulses into the reaction space; (d) exciting an RF plasma in pulses in the reaction space, wherein each pulse of exciting the RF plasma starts immediately after each pulse of introducing the precursor, wherein one cycle is defined by one pulse of introducing the precursor with no pulse of exciting the RF plasma as a first period, one pulse of exciting the RF plasma with no pulse of introducing the precursor as a second period, and no pulse of introducing the precursor and no pulse of exciting the RF plasma as a third period; and (e) forming a dielectric film having Si—N bonds on the substrate by repeating the cycle multiple times.

In some embodiments, the Si-containing precursor may comprise Si, N, H, and optionally C in its molecule. In some embodiments, the Si-containing precursor may have a formula of $Si\alpha H\beta X\gamma$, wherein $\alpha$ and $\beta$ are integers and $\gamma$ is an integer including zero, X is N and/or $C_mH_n$ wherein m and n are integers. In some embodiments, $\alpha$ may be 1 to 5, $\beta$ may be 1 to 10, and $\gamma$ may be 0 to 6. In some embodiments, m may be 2 to 18, and n may be 6 to 30. In some embodiments, the Si-containing precursor may be vapor or liquid at room temperature. In some embodiments, the Si-containing precursor may be selected from the group consisting of silane, disilane, trysilylamine, and bis(tert-butylamino)silane.

In any of the foregoing embodiments, the Si-containing precursor may be a carbon-free precursor which is a first precursor, and the method further comprises introducing a second precursor in one cycle, wherein the second precursor is different from the first precursor and comprises a Si—N, C—H, or N—H bond in its molecule. In an embodiment, the carbon-free silicon precursor may be vapor or liquid at room temperature. In some embodiments the carbon free silicon precursor may be selected from the group consisting of silane, disilane, trisilane, dichlorosilane, trysilylamine, and mixtures thereof.

In some embodiments, the second precursor may have a formula of $Si_\alpha A_\beta B_\gamma$, wherein $\alpha$, $\beta$ and $\gamma$ are integers and $\gamma$ includes zero, A is H or Cl, and B is N.

In some embodiments, the second precursor may be $NH_3$ or $C_xH_y$, or hydrocarbon containing silicon precursor, where x and y is integers. In some embodiments, x may be 1 to 8 and y may be 4 to 18. In some embodiments, the second precursor may be selected from a hydrocarbon-containing silicon gas, a hydrocarbon gas, and an ammonium gas. In some embodiments, the hydrocarbon-containing silicon gas may be selected and may have a formula of $Si_aH_bN_c(C_mH_n)$ wherein a is an integer of 1 to 5, b is an integer of 1 to 10, and c is an integer of 0 to 6, m is an integer of 2 to 18, and n is an integer of 6 to 30.

In some embodiments, the Si-containing precursor may be vaporized upstream of the reaction space.

In some embodiments, the Si-containing precursor may be introduced in pulses having a duration of approximately 0.1 sec to 1.0 sec.

In some embodiments the pulses of the Si-containing precursor are of duration of about 0.1 sec to about 0.3 sec.

In some embodiments, the duration of the pulse precursor may be equal to or shorter than the duration of the plasma excitation.

In some embodiments, a combination of at least one Si-containing precursor which is a gas comprising Si, N, and H in its molecule, at least one second precursor which is a gas different from the precursor and comprises Si, C, or N in its molecule, at least one reactive gas which is nitrogen gas and/or hydrogen gas, and at least one additive gas which is a rare gas.

In some embodiments, the excitation of the RF plasma may be conducted in pulses having a duration of approximately 0.1 sec to 1.0 seconds and starts 0 to 0.1 seconds (including less than 0.07, 0.05, 0.03, and 0.01 seconds, or substantially or operationally zero second) after the shutting off of the Si-containing precursor in each cycle. The substantially or operationally zero refers to a series of operations programmed to start the RF plasma excitation is immediately after the end of the precursor introduction in some embodiments, wherein a certain mechanical or control delay may occur. In some embodiments, the pulse supply duration may be equal to or shorter than the plasma exiting duration.

In some embodiments, the introduction of the reactive gas and the rare gas may be maintained in each cycle as a purge for approximately 0.5 to 2.0 sec after the excitation of the PF plasma ends. In some embodiments, the duration of the purge may be equal to or longer than the duration of the RF plasma excitation in one cycle.

In some embodiments, the reactive gas may be at least one of a mixture of N2 and H2, a mixture of NH3 and H2, and a nitrogen-boron-hydrogen gas. In some embodiments, the reactive gas may be the mixture of N2 and H2 wherein a molar flow rate ratio of N2/H2 in the mixture is approximately 1/1 to 10/1. In some embodiments the molar flow rate ratio of $N_2$ and $H_2$ is about 2/1 to about 4/1. In some embodiments, the reactive gas may be the mixture of NH3 and H2 wherein a molar flow rate ratio of NH3/H2 in the mixture is approximately 1/1 to 1/10. In some embodiments the molar flow rate ratio of $NH_3/H_2$ is approximately 1:1 to 1:3.

In any of the foregoing embodiments, the substrate may be kept at a temperature of 0° C. to 400° C. while the film is deposited thereon. In some embodiments the substrate temperature is about 250° C. to about 390° C. during deposition.

In any of the foregoing embodiments, the rare gas may be one or more gases selected from the group consisting of He, Ar, Kr, and Xe, and the molar flow rate of the rare gas may be greater than the molar flow rate of the Si-containing precursor. In some embodiments, a flow rate of the rare gas introduced into the reaction chamber may be about 30 sccm to about 3000 sccm. In some embodiments, the flow rate of the rare gas is about 1500 sccm to about 2500 sccm. In some embodiments, the rare gas may comprise a mixture of helium and argon or a mixture of helium and krypton. In some embodiments, the rare gas may comprise a mixture of helium and argon with a molar flow rate ratio of helium/argon of about 3/1 to about 20/1. In some embodiments, the molar flow rate ratio of helium/argon is about 5/1 to about 15/1. In some embodiments, the rare gas comprises a mixture of helium and krypton with a molar flow rate ratio of helium/krypton is about 5/1 to about 15/1.

In any of the foregoing embodiments, the RF power may be applied in the range of approximately 0.02 $W/cm^2$ to approximately 2.0 $W/cm^2$ per area of the substrate (e.g., a range of 0.05-10 $W/cm^2$, a range of 1-5 $W/cm^2$, and a range of 0.5-3 $W/cm^2$) and the reaction space pressure may be adjusted in the range of approximately 0.1 Torr to approximately 10 Torr (e.g., 2 Torr to 9 Torr).

In any of the foregoing embodiments, formed a dielectric film having Si—N bonds with the present invention may has a step coverage or conformality of at least 90% (e.g., 90% to 95%). In some embodiments, formed a dielectric film having Si—N bonds with the present invention may has an etching rate lower than thermal oxide film. In some embodiments, formed a dielectric film having Si—N bonds with the present invention may has a leakage current of lower than 1.0E-08 $A/cm^2$ at 1 MV (e.g., 1.0E-08 $A/cm^2$ to 1.0E-10 $A/cm^2$).

In any of the foregoing embodiments, the dielectric constant of the dielectric layer having Si—N bonds may be in the range of 4.5 to 7.5. In some embodiments the dielectric constant is about 6.5 to about 7.2.

In any of the foregoing embodiments, the substrate may be kept at a temperature of 0° C. to 600° C. while the film is deposited thereon. In some embodiments the substrate temperature is about 300° C. to about 550° C. during deposition.

Additionally, a plasma exiting step can be performed using a frequency exceeding 5 MHz, e.g., any one of high RF frequency power of 13.56 MHz, 27 MHz or 60 MHz, in some embodiments; further, any one of the foregoing high RF frequency power and low RF power of 5 MHz or less can be combined wherein a ratio of low-frequency power to high-frequency power may be 0 to 50% or less (e.g., 0 to 30% or less).

Embodiments are explained with reference to the drawings which are not intended to limit the present invention. FIG. 1 is a schematic view of an apparatus combining a plasma CVD reactor and flow control valves, which can be used in some embodiments of the present invention.

In this example, by providing a pair of electrically conductive flat-plate electrodes 4, 2 in parallel and facing each other in the interior 11 of a reaction chamber 3, applying HRF power (13.56 MHz or 27 MHz) 5 and LRF power of 5 MHz or less (400 kHz~500 kHz) 50 to one side, and electrically grounding 12 the other side, a plasma is excited between the electrodes. A temperature regulator is provided in a lower stage 2 (the lower electrode), and a temperature of a substrate 1 placed thereon is kept constant at a given temperature. The upper electrode 4 serves as a shower plate as well, and reaction gas and rare gas are introduced into the reaction chamber 3 through a gas flow controller 23, a pulse flow control valve 31, and the shower plate. Additionally, in the reaction chamber 3, an exhaust pipe 6 is provided through which gas in the interior 11 of the reaction chamber 3 is exhausted. Additionally, the reaction chamber is provide with a seal gas flow controller 24 to introduce seal gas into the interior 11 of the reaction chamber 3 (a separation plate for separating a reaction zone and a transfer zone in the interior of the reaction chamber is omitted from this figure).

For the pulse flow control valve 31, a pulse supply valve that is used for ALD (atomic layer deposition) can suitably be used in some embodiments.

Figure 2:
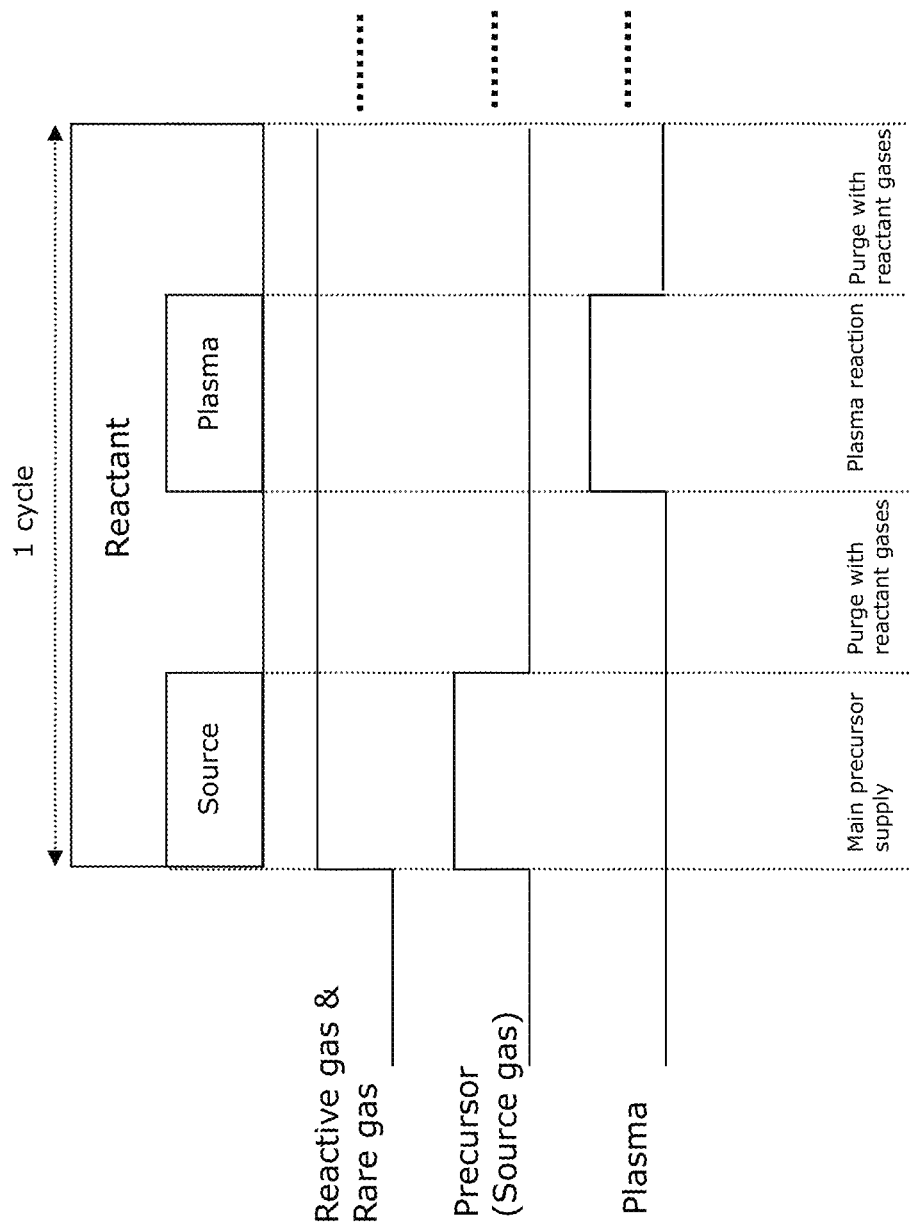
FIG. 2 shows process steps of a comparative PEALD method for deposition a dielectric layer having Si—N bonds.
Figure 3:
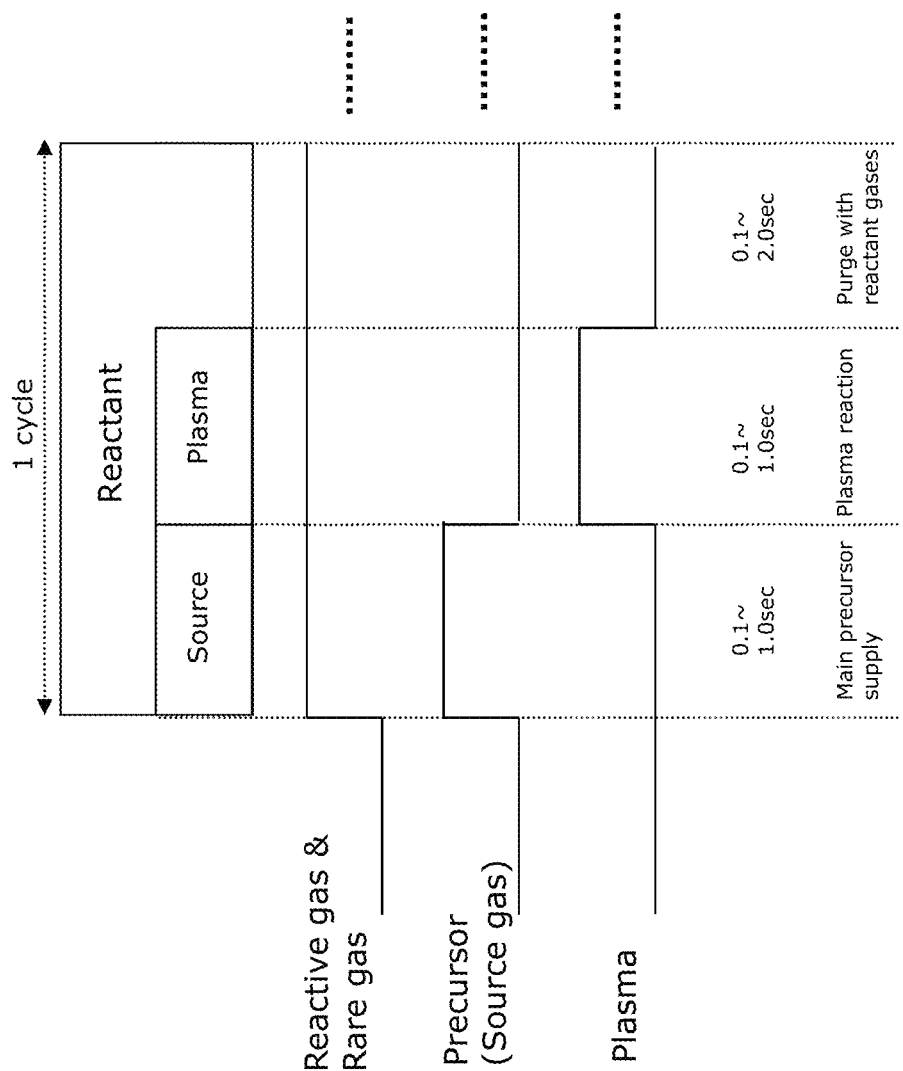
FIG. 3 shows process steps of a modified PEALD method for depositing a dielectric layer having Si—N bonds according to some embodiments of the present invention.

FIG. 2 shows process steps of a comparative PEALD method and FIG. 3 shows process steps of some embodiments of the present invention method for depositing a dielectric film having Si—N bonds. The comparative method is carried out as shown FIG. 2 wherein a main precursor (source gas) is introduced in pulse into a reaction chamber inside which a substrate is placed while maintaining the supply of the reactant gases (the reactive gas and rare gas are collectively referred to as the reactant gases), and after an interval with the supply of the reactant gases as a purge step, a plasma is excited while maintaining the supply of the reactant gases, followed by another purge step with the reactant gases. Consequently, a dielectric film having Si—N bonds can be formed on the substrate. The formed dielectric film having Si—N bonds by the comparative PECVD method has an extremely low deposition rate that may be caused by the poor binding reaction on a surface which prevents surface vapor phase absorption of the depositing material. In contrast, the embodiment of the present invention as shown FIG. 3 introduces a main precursor (source gas) in pulse of approximately 0.1 sec to approximately 1.0 sec while maintaining the supply of the reactant gases into the reaction chamber and a plasma is exited approximately 0.1 sec to approximately 1.0 sec immediately (0~0.1 sec) after shutting off the main precursor. After the excitation of a plasma, an interval with the supply of the reactant gases is carried out for approximately 0.5 sec to approximately 2.0 sec as a purge step. By doing this, a large amount of hydrogen and nitrogen can be added to the process which is believed to significantly enhance the Hx, Nx radicals during film growth, resulting in improving surface absorption of the deposition material so as to form a dielectric film having Si—N bonds on a substrate with a high deposition rate. In addition, in the embodiment of the present invention, the purging is conducted only once in one cycle, whereas in the comparative method, the purging is conducted twice in one cycle.

In some embodiments, a thickness of layer deposited per cycle with conventional PEALD method illustrated in FIG. 2 may be approximately 0.02 nm/cycle to approximately 0.05 nm/cycle. In contrast, a thickness of a layer deposited per cycle with the modified PEALD method illustrated in FIG. 3 may be approximately 0.15 nm/cycle to approximately 0.20 nm/cycle, and the deposition cycle is continued until a desired thickness of film is obtained.

According to embodiments of the present invention, the deposition rate and conformality of film can surprisingly be improved as compared with other silicon nitride deposition processes.

For forming a dielectric layer having Si—N bonds on a semiconductor substrate, deposition conditions in some embodiments may be as follows:

Trisilylamine (precursor): 10~2000 sccm (preferably 100~500 sccm)

Hydrogen (reactive gas): 50~2000 sccm (preferably 500~1000 sccm)

Nitrogen (reactive gas): 0~5000 sccm (preferably 500~1000 sccm)

Process helium (rare gas): 0~3000 sccm (preferably 100~2000 sccm)

Sealed helium: 200~500 sccm (preferably 300~500 sccm)

Argon (rare gas): 50~2000 sccm (preferably 500~1500 sccm)

Substrate temperature: 0~400° C. (preferably 300~400° C.)

High frequency RF power: 0.01 W/cm$^2$ to about 0.3 W/cm$^2$ (preferably 0.02~0.08 W/cm$^2$)

Low frequency RF power: 0~100% or less of high frequency RF power (preferably 0~50%)

Trisilylamine supply time: 0.1~1.0 sec supply (preferably 0.2~0.7 sec)

RF plasma exiting time: 0.1~1.0 sec excite (preferably 0.2~1.0 sec)

Purge time: 0.5~2.0 sec purge with reactant gases (preferably 0.5~1.0 sec)

The dielectric layer having Si—N bonds according to embodiments of the present invention may have deposition rate of 5 times higher than that of conventional PEALD method and may have conformality of more than about 90%. Leakage current may be lower than about 1.0E-08 A/cm$^2$ at 1 MV charge. In another embodiment, the dielectric constant may be about 6.7 to about 7.3 and the reflective index at 633 nm may be in the range of about 1.8 to about 2.5. The etching rate of deposited silicon nitride film according to some embodiments of the present invention as measured using buffered hydrogen fluoride may be 2 times to 10 time smaller than a conventional thermal silicon oxide film.

The dielectric layer according to embodiments of the present invention may have conformality of more than about 90%, preferably no less than 95%. The reflective index (n) measured at 633 nm may be in the range of about 1.80 to about 2.80. The etching rate of deposited dielectric film according to some embodiments of the present invention as measured using acids solutions containing hydrofluoric acid can be altered by adding additive precursor. The wet etching rate of dielectric layers obtained using first and second precursors can surprisingly and unexpectedly be about 2/1 to about 1/20 (e.g., 2/1 to 1/10) of the wet etching rate of a standard thermal oxide layer, depending upon the type of second precursor. The wet etching rate of dielectric layers obtained without using the second precursor may be 1/3 to 1/5 of the wet etching rate of a standard thermal oxide layer in some embodiments.

Figure 6:
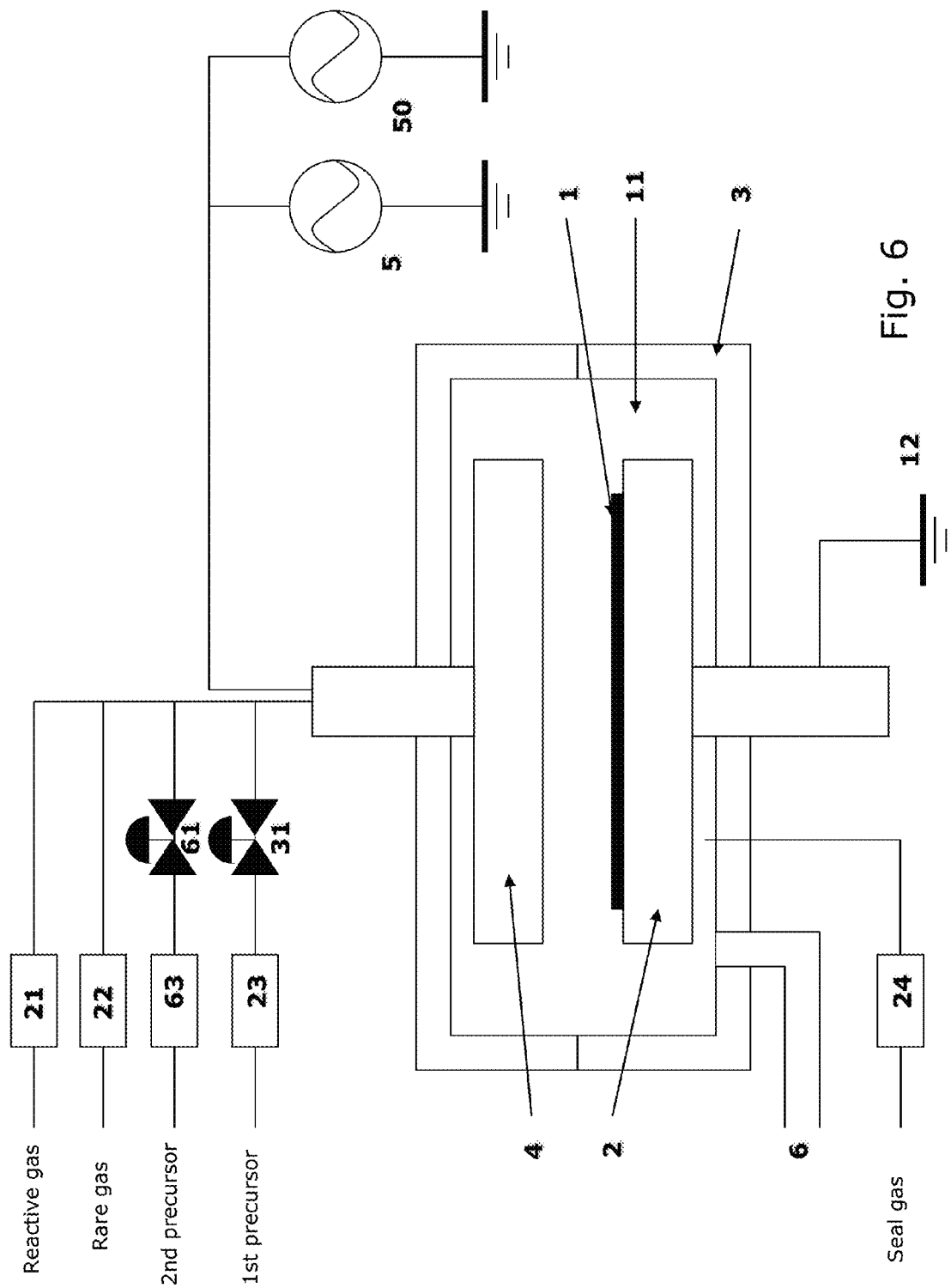
FIG. 6 is a schematic representation of a PEALD apparatus for depositing a dielectric layer having Si—N bonds according to some embodiments of the present invention.

Embodiments are explained with reference to the drawings which are not intended to limit the present invention. FIG. 6 is a schematic view of an apparatus combining a plasma CVD reactor and flow control valves, which can be used in some embodiments of the present invention.

In this example, by providing a pair of electrically conductive flat-plate electrodes 4, 2 in parallel and facing each other in the interior 11 of a reaction chamber 3, applying HRF power (13.56 MHz or 27 MHz) 5 and LRF power of 5 MHz or less (400 kHz~500 kHz) 50 to one side, and electrically grounding 12 the other side, a plasma is excited between the electrodes. A temperature regulator is provided in a lower stage 2 (the lower electrode), and a temperature of a substrate 1 placed thereon is kept constant at a given temperature. The upper electrode 4 serves as a shower plate as well, and reactive gas, rare gas, second precursor and first precursor are introduced into the reaction chamber 3 through gas flow controllers 21, 22, 63, and 23, respectively, and a pulse flow control valve 31 for the first precursor and a pulse flow control valve 61 for the second precursor, and further through the shower plate 4. Additionally, in the reaction chamber 3, an exhaust pipe 6 is provided through which gas in the interior 11 of the reaction chamber 3 is exhausted. Additionally, the reaction chamber is provide with a seal gas flow controller 24 to introduce seal gas into the interior 11 of the reaction chamber 3 (a separation plate for separating a reaction zone and a transfer zone in the interior of the reaction chamber is omitted from this figure).

For the pulse flow control valve 31, a pulse supply valve that is used for ALD (atomic layer deposition) can suitably be used in some embodiments.

Figure 7:
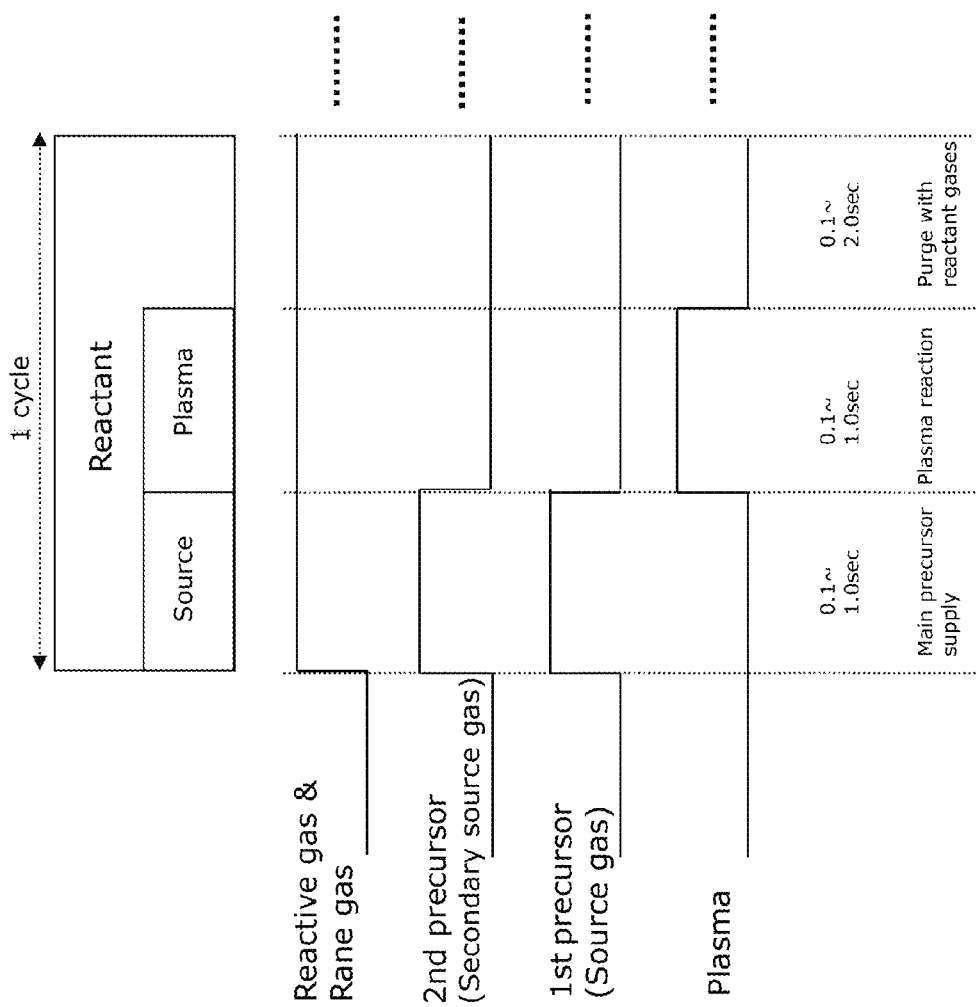
FIG. 7 shows process steps of a modified PEALD method for depositing a wet etching rate controlled dielectric layer having Si—N bonds according to some embodiments of the present invention.
Figure 8:
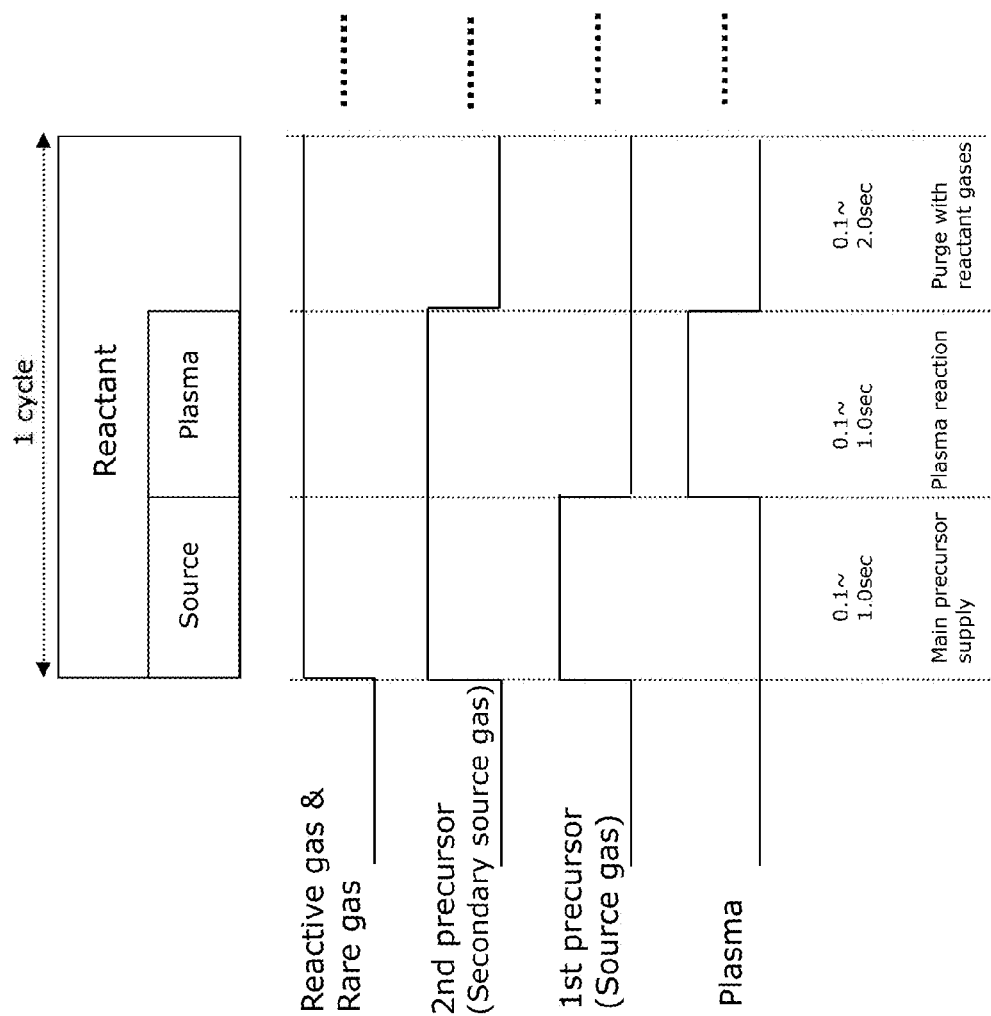
FIGS. 8 and 9 show process steps of modified PEALD methods according to other embodiments of the present invention.
Figure 9:
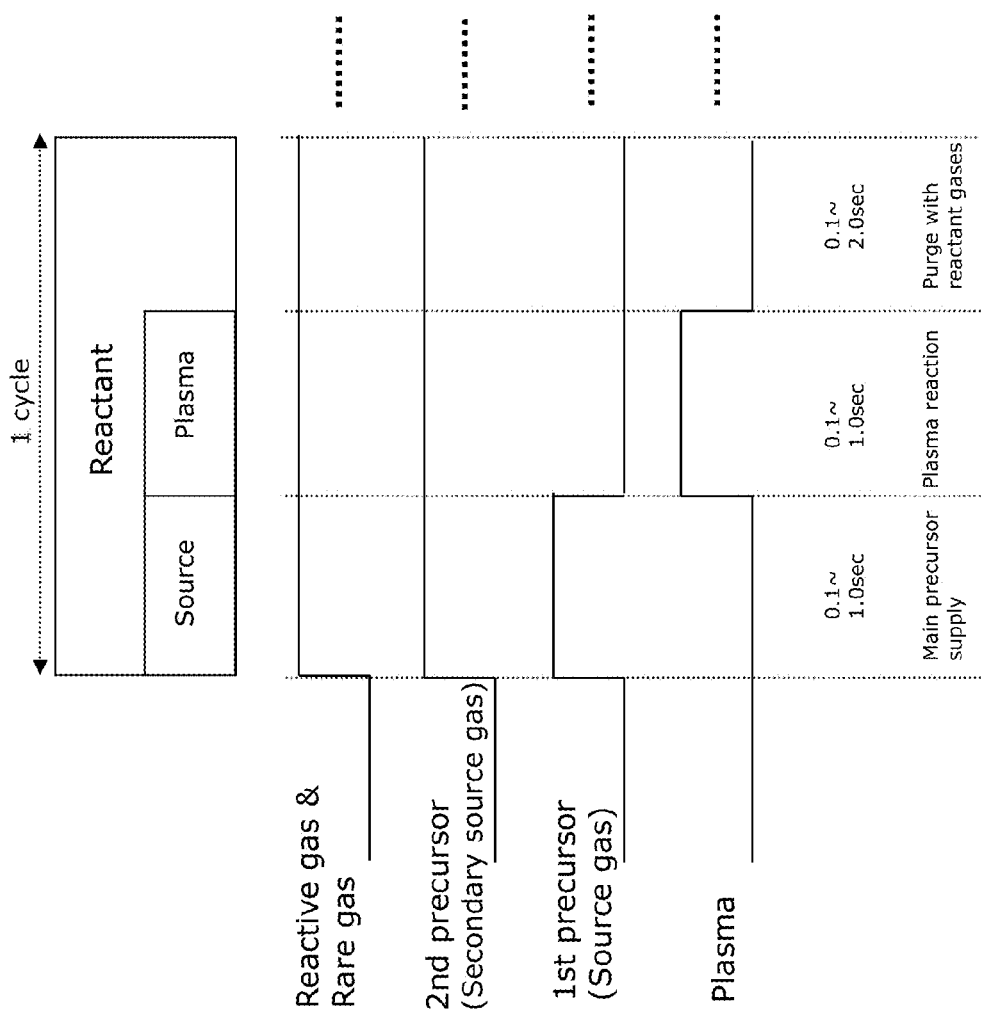

FIG. 7 shows process steps of some embodiments of the present invention method for depositing an etch property-turned dielectric film having Si—N bonds. The conventional PEALD method (not shown) is carried out as a main precursor is introduced in pulse into a reaction chamber inside which a substrate is placed while maintaining the supply the reactive gases, and after interval with reactive gases supply, plasma is excited while maintaining the supply of the reactive gases. Consequently, a dielectric film having Si—N bonds can be formed on the substrate. Formed dielectric film having Si—N bonds by the conventional PECVD method has extremely low deposition rate that may be caused by the poor binding reaction on surface which prevents surface vapor phase absorption of depositing material. In contrast, the embodiment of the present invention as shown FIG. 7 introduces a main precursor and second precursor in pulse approximately 0.1 sec to approximately 1.0 sec while maintaining the supply of the reactive gases and rare gases into the reaction chamber and plasma is exited approximately 0.1 sec to approximately 1.0 sec immediately after (0~0.1 sec) shuts off the main precursor. After exiting plasma, interval with reactive gases supply is carried out approximately 0.5 sec to approximately 2.0 sec. By doing this, a large amount of hydrogen and nitrogen can be added to the process which is believed to significantly enhance the Hx, Nx radicals during film growth, resulting in improving surface absorption of the deposition material so as to form a dielectric film having Si—N bonds on a substrate with high deposition rate. Furthermore, deposited modifying etch properties dielectric film having Si—N bonds with the present invention is defined that possess a morphological structure, such as conformality, similar to silicon nitride film by PEALD. However, a composition of deposited film has been altered by adding second precursor. These add can lead to changes in performance properties such as wet etching rate in etchants.

In some embodiments, process steps of some embodiments of the present invention method shown as FIG. 2 can be modified as FIG. 3a or FIG. 3b.

For forming an etch property-turned dielectric layer having Si—N bonds on a semiconductor substrate, deposition conditions in some embodiments may be as follows:

Trisilylamine (precursor): 10~2000 sccm (preferably 100~500 sccm)

Hydrogen (reactive gas): 20~2000 sccm (preferably 500~1000 sccm)

Nitrogen (reactive gas): 0~5000 sccm (preferably 20~1000 sccm)

Ammonia (reactive gas): 0~1000 sccm (preferably 500~1000 sccm)

Hexane (second precursor): 0~1000 sccm (preferably 100~500 sccm)

Diethylsilane (second precursor): 0~1000 sccm (preferably 100~500 sccm)

Bis(ethylmethylamino)silane (second precursor): 0~1000 sccm (preferably 100~500 sccm)

Process helium (rare gas): 0~3000 sccm (preferably 100~2000 sccm)

Sealed helium: 200~500 sccm (preferably 300~500 sccm)

Argon (rare gas): 50~2000 sccm (preferably 500~2000 sccm)

Flow ratio of second precursor to first precursor: 1~5 (preferably 1~2)

Substrate temperature: 0~600° C. (preferably 300~500° C.)

High frequency RF power: 0.01 W/cm$^2$ to about 0.3 W/cm$^2$ (preferably 0.02~0.08 W/cm$^2$)

Low frequency RF power: 0~100% or less of high frequency RF power (preferably 0~50%)

First precursor (e.g., trisilylamine) supply time: 0.1~1.0 sec supply (preferably 0.2~0.7 sec)

Second precursor (e.g. hexane, diethylsilane, bis(ethylmethylamino)silane) supply time: 0.1~1.0 sec supply (preferably 0.2~0.7 sec)

RF plasma exiting time: 0.1~1.0 sec excite (preferably 0.2~1.0 sec)

Purge time: 0.5~2.0 sec purge with reactant gases (preferably 0.5~1.0 sec)

Second precursor (Hexane) supply time: 0.1~1.0 sec supply (preferably 0.2~0.7 sec, equal to or longer than the first precursor supply time with the same timing of pulsing as the first precursor supply)

In the above, other types of gases as described in this disclosure can alternatively or additionally be used in other embodiments. For example, instead of hexane, bis(ethylmethyamino)silane or diethylsislane can be used as the second precursor. Preferably, the second precursor has more hydrocarbons in its molecule than the first precursor, thereby incorporating more carbons in SiN structures (carbon-doped silicon nitride). In embodiments, the carbon content of the SiN dielectric layer (wherein Si—N bonds are main or predominant bonds) may be in a range of 4 atomic % to 20 atomic %, preferably higher than 5 atomic % (including higher than 10 atomic % and higher than 15 atomic %). The second precursor need not contain silicon in some embodiments.

The disclosed embodiments will be explained with reference to specific examples which are not intended to limit the present invention. The numerical numbers applied in the specific examples may be modified by a range of at least ±50% in other conditions, wherein the endpoints of the ranges may be included or excluded. In the present disclosure where conditions and/or structures are not specified, the skilled artisan in the art can readily provide such conditions and/or structures, in view of the present disclosure, as a matter of routine experimentation.

EXAMPLE 1 (COMPARATIVE EXAMPLE)

Figure 4:
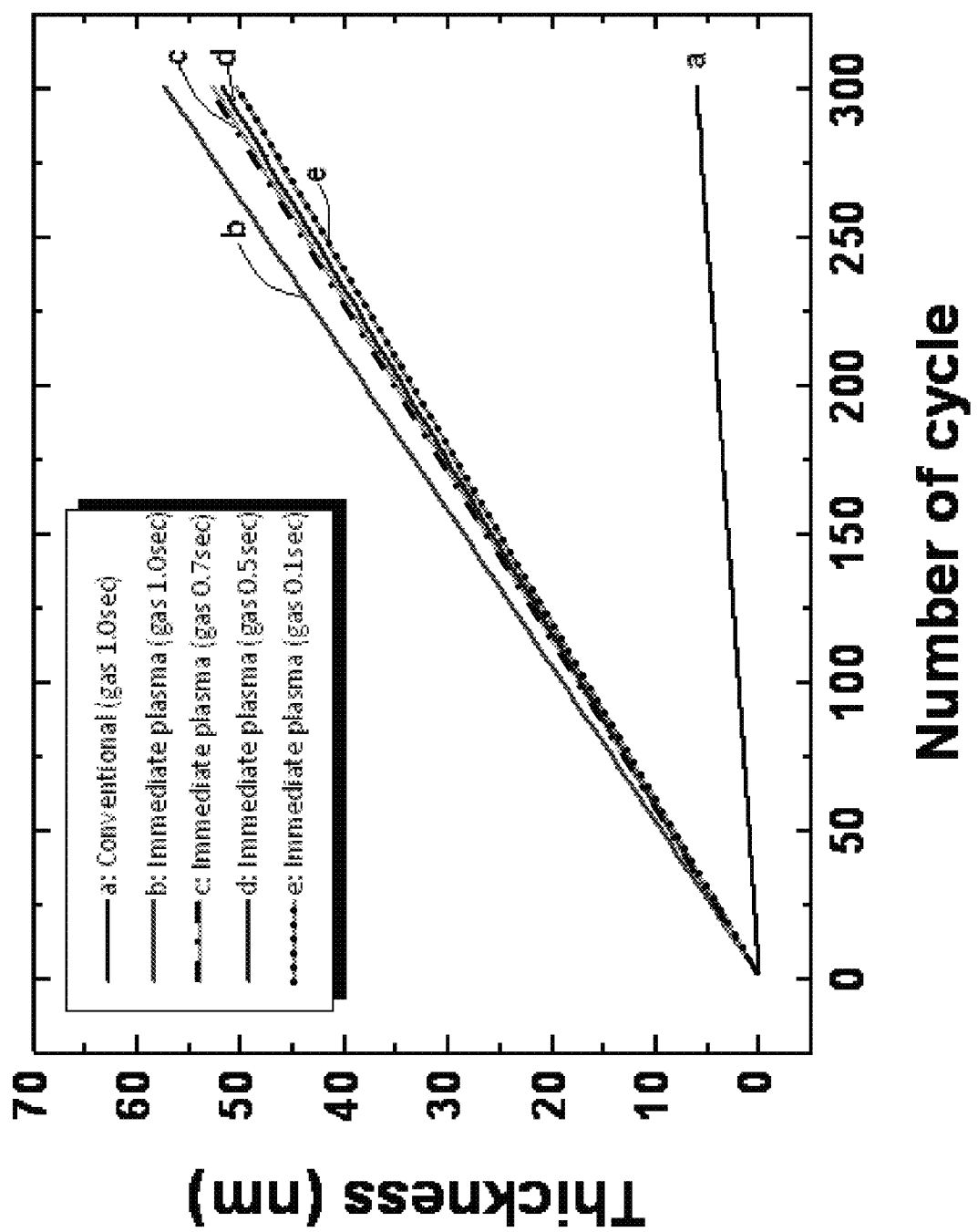
FIG. 4 is a graph showing relationships between the number of cycles of deposition and the thickness of depositing films, indicating the deposition rates of dielectric layers having Si—N bonds according to embodiments of the present invention method (b to d) and according to the comparative PEALD method (a).

A dielectric layer having Si—N bonds was formed on a substrate under the condition shown below using the sequence illustrated in FIG. 2 and the PEALD apparatus illustrated in FIG. 1.
  Trisilylamine: 100 sccm
  Hydrogen: 500 sccm
  Nitrogen: 1000 sccm
  Process helium: 1400 sccm
  Sealed helium: 500 sccm
  Argon: 500 sccm
  Substrate temperature: 350° C.
  High frequency RF power (a frequency of 13.56 MHz): 0.07 W/cm$^2$
  Low frequency RF power (a frequency of 430 kHz): 0.0 W/cm$^2$
  Trisilylamine supply time: 1.0 sec supply
  Purge time: 1.0 sec interval with reactive gases
  RF Plasma exciting time: 1.0 sec excite
FIG. 4 shows film thickness per cycle of this comparative PEALD method and the disclosed embodiments of the present invention method. In case of the comparative PEALD method (line "a"), the film thickness per cycle is approximately 0.02 nm/cycle. In contrast, in case of the disclosed embodiments of the present invention method (Example 2), the film thickness per cycle is approximately 0.17~0.19 nm/cycle. In the disclosed embodiments, the deposition rates of dielectric films having Si—N bonds are surprisingly high which are about 10 times higher than that of the comparative PEALD method.

EXAMPLE 2

A dielectric layer having Si—N bonds was formed on a substrate under the condition shown below using the sequence illustrated in FIG. 3 and the PEALD apparatus illustrated in FIG. 1.
  Trisilylamine: 100 sccm
  Hydrogen: 500 sccm
  Nitrogen: 1000 sccm
  Process helium: 1400 sccm
  Sealed helium: 500 sccm
  Argon: 500 sccm
  Substrate temperature: 350° C.
  High frequency RF power (a frequency of 13.56 MHz): 0.07 W/cm$^2$
  Low frequency RF power (a frequency of 430 kHz): 0.0 W/cm$^2$
  Trisilylamine supply time: 1.0, 0.7, 0.5, and 0.1 sec supply
  RF Plasma exciting time: 1.0 sec excite
  Purge time: 1.0 sec interval with reactive gases FIG. 4 shows film thickness per cycle of the comparative PEALD method and the disclosed embodiments of the present invention method. In case of the disclosed embodiments (immediate RF plasma), the film thickness per cycle is approximately 0.17~0.19 nm/cycle as shown in line "b" (1.0 sec pulse of precursor supply), line "c" (0.7 sec pulse of precursor supply), line "d" (0.5 sec pulse of precursor supply), and line "e" (0.1 sec pulse of precursor supply). In the disclosed embodiments, the deposition rates of dielectric films having Si—N bonds are surprisingly high which are about 10 times higher than that of the comparative PEALD method.

Figure 5:
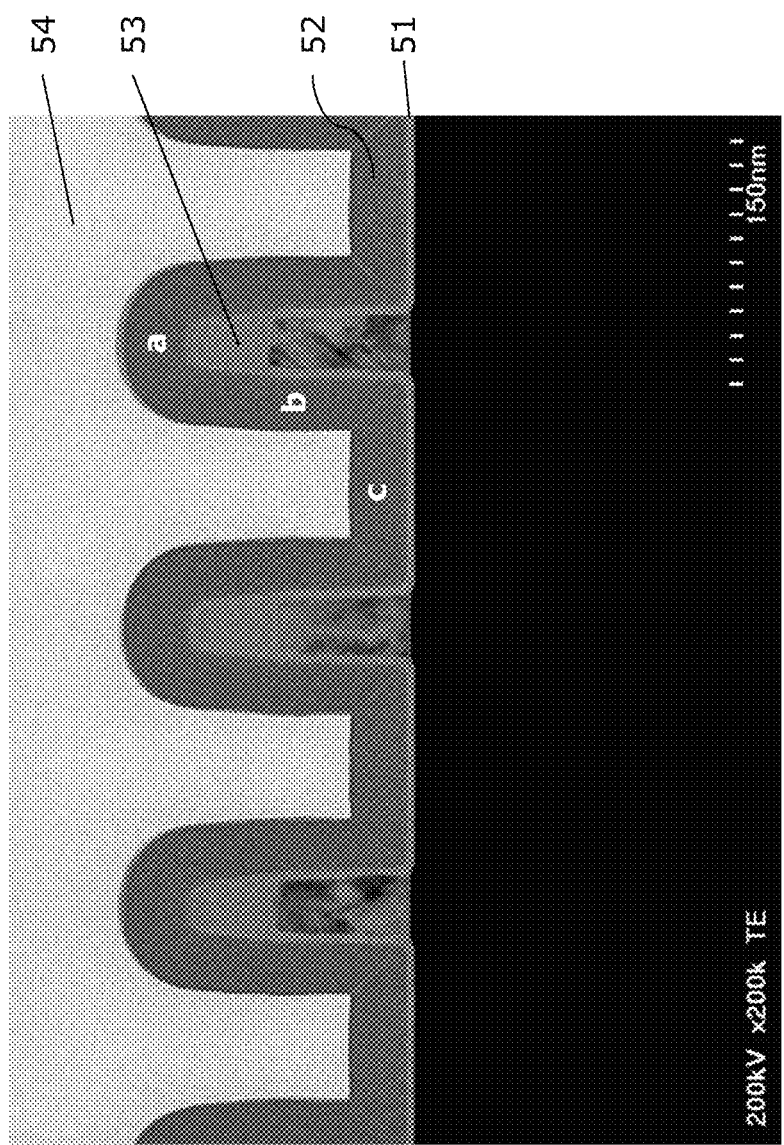
FIG. 5 is a cross sectional SEM photograph of a dielectric layer having Si—N bonds on a substrate containing small features according to some embodiments of the present invention.

After completion of the deposition with a precursor supply pulse of 1.0 sec (this embodiment refers to Example 2a), the metal gates were observed with a transmission electron microscope. FIG. 5 shows the transmission electron microscope cross-sectional view of the metal gates on a substrate 54 with a conformal silicon nitride layer 52 formed thereon. Qualitatively, the silicon nitride layer 52 is highly conformal and completely covers sidewalls of trenches of a substrate 54. The silicon nitride layer 52 had a conformality of no less than 95.1%: (34.4 nm/37.2 nm) as shown in FIG. 5 (a=37.2 nm, b=35.4 nm, c=37.0 nm)). In FIG. 5, after the formation of the silicon nitride layer 52, a silicon oxide layer 51 was formed, followed by filling the trenches with polysilicon 53.

Leakage current of the silicon nitride was lower than 1.0E-08 A/cm$^2$ at 1 MV charge. The dielectric constant thereof was 6.8 at 1 MHz. The reflective index (n) thereof at 633 nm was 2.01. The etching rate of deposited silicon nitride film in this example as measured using buffered hydrogen fluoride was 5.3 nm/min which was less than ¼ of that of a standard thermal silicon oxide film (see "none" in FIG. 10). The etching test was carried out using a BHF130 etchant. The deposited film (SiN) on the Si substrate was dipped in the BHF130 etchant for 5 min, and then rinsed with de-ionized water. Film thickness was measured by an Ellipsometer.

A significant advantage of the method of at least one of the disclosed embodiments of the present invention is that silicon nitride layers or other Si—N dielectric layers can be formed on semiconductor substrates. The silicon nitride layers and other Si—N dielectric layers also may be formed at relatively low substrate temperatures, thereby increasing productivity without the occurrence of thermal damage to the substrate, and expanding the types of applicable substrates. In addition, the method of some embodiments of the present invention can control thickness exactly, and achieve high deposition rate, and can achieve high conformal structure.

EXAMPLE 3

A dielectric layer having Si—N bonds was formed with second precursor, for example ammonia, on a substrate under the condition shown below using the sequence illustrated in FIG. 2 and the PEALD apparatus illustrated in FIG. 1.
  Trisilylamine: 100 sccm
  Hydrogen: 500 sccm
  Nitrogen: 1000 sccm
  Ammonia: 300 sccm
  Process helium: 1400 sccm
  Sealed helium: 500 sccm
  Argon: 500 sccm
  Substrate temperature: 350° C.
  High frequency RF power (a frequency of 13.56 MHz): 0.07 W/cm$^2$
  Low frequency RF power (a frequency of 430 kHz): 0.0 W/cm$^2$
  Trisilylamine supply time: 1.0 sec supply Second precursor (Ammonia) supply time: 1.0 sec supply
RF Plasma exciting time: 1.0 sec excite
Purge time: 1.0 sec interval with reactive gases In case of adding ammonia, the film thickness per cycle is approximately 0.25 nm/cycle. Deposited dielectric film having Si—N bonds with adding $NH_3$ has wet etch rate 37 nm/min under BHF130 etchant.

EXAMPLE 4

A dielectric layer having Si—N bonds was formed with second precursor, for example Bis(ethylmethylamino)silane, on a substrate under the condition shown below using the sequence illustrated in FIG. 2 and the PEALD apparatus illustrated in FIG. 1.
Trisilylamine: 100 sccm
Hydrogen: 500 sccm
Nitrogen: 1000 sccm
Bis(ethylmethylamino)silane: 300 sccm
Process helium: 1400 sccm
Sealed helium: 500 sccm
Argon: 500 sccm
Substrate temperature: 350° C.
High frequency RF power (a frequency of 13.56 MHz): 0.07 W/cm$^2$
Low frequency RF power (a frequency of 430 kHz): 0.0 W/cm$^2$
Trisilylamine supply time: 1.0 sec supply
Second precursor (Bis(ethylmethylamino)silane) supply time: 1.0 sec supply
RF Plasma exciting time: 1.0 sec excite
Purge time: 1.0 sec interval with reactive gases In case of adding Bis(ethylmethylamino)silane, the film thickness per cycle is approximately 0.17 nm/cycle. Deposited dielectric film having Si—N bonds with adding bis(ethylmethylamino)silane has wet etch rate 2.9 nm/min under BHF130 etchant.

EXAMPLE 5

A dielectric layer having Si—N bonds was formed with second precursor, for example hexane, on a substrate under the condition shown below using the sequence illustrated in FIG. 2 and the PEALD apparatus illustrated in FIG. 1.
Trisilylamine: 100 sccm
Hydrogen: 500 sccm
Nitrogen: 1000 sccm
Hexane: 300 sccm
Process helium: 1400 sccm
Sealed helium: 500 sccm
Argon: 500 sccm
Substrate temperature: 350° C.
High frequency RF power (a frequency of 13.56 MHz): 0.07 W/cm$^2$
Low frequency RF power (a frequency of 430 kHz): 0.0 W/cm$^2$
Trisilylamine supply time: 1.0 sec supply
Second precursor (Hexane) supply time: 1.0 sec supply
RF Plasma exciting time: 1.0 sec excite
Purge time: 1.0 sec interval with reactive gases In case of adding hexane, the film thickness per cycle is approximately 0.22 nm/cycle. Deposited dielectric film having Si—N bonds with adding hexane has wet etch rate 1.1 nm/min under BHF130 etchant.

Figure 10:
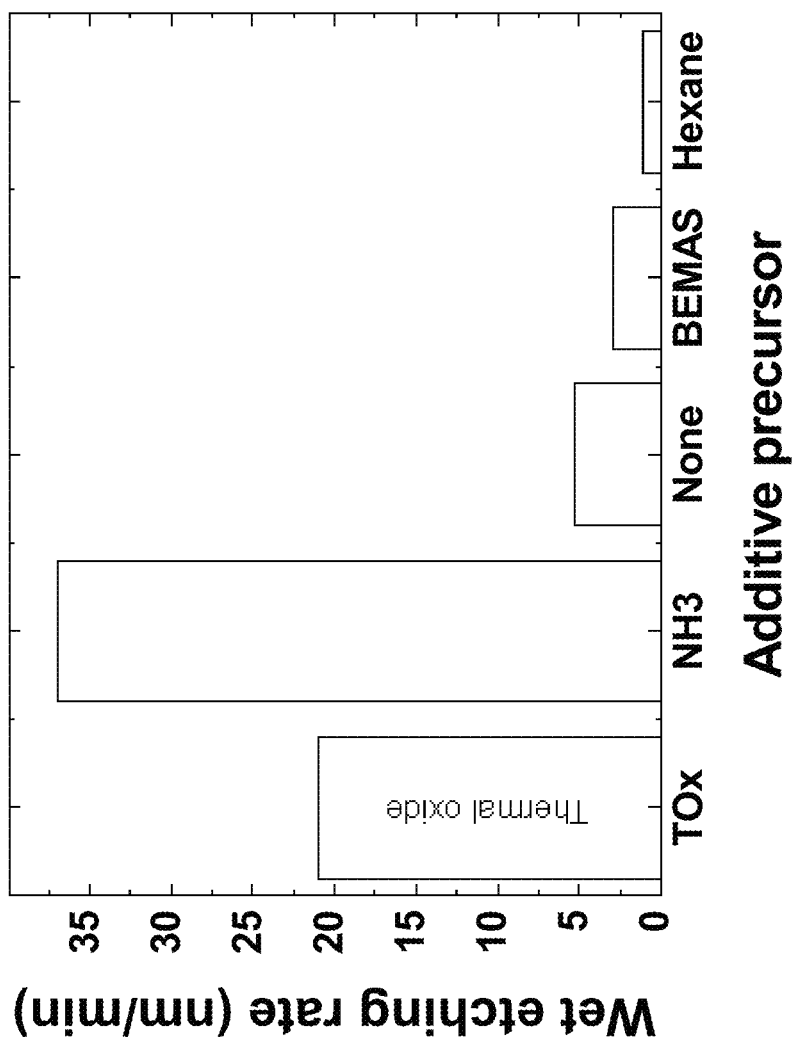
FIG. 10 is a graph showing wet etching rates of dielectric layers having Si—N bonds obtained by embodiments of the present invention as compared with that of a standard thermal oxide layer.

According to the transmission electron microscope cross-sectional view of the metal gates on substrate using above examples (not shown), deposited modifying etch properties dielectric film having Si—N bonds with second precursor is possessed similar morphological structure, such as conformality (up to 90%), to the dielectric film having Si—N bonds without second precursor. By adding second precursor, composition of deposited film has been altered. These add can lead to changes in performance properties such as wet etching rate in etchants. FIG. 10 shows the wet etching rates when using various second precursors as explained in the above examples.

Figure 11:
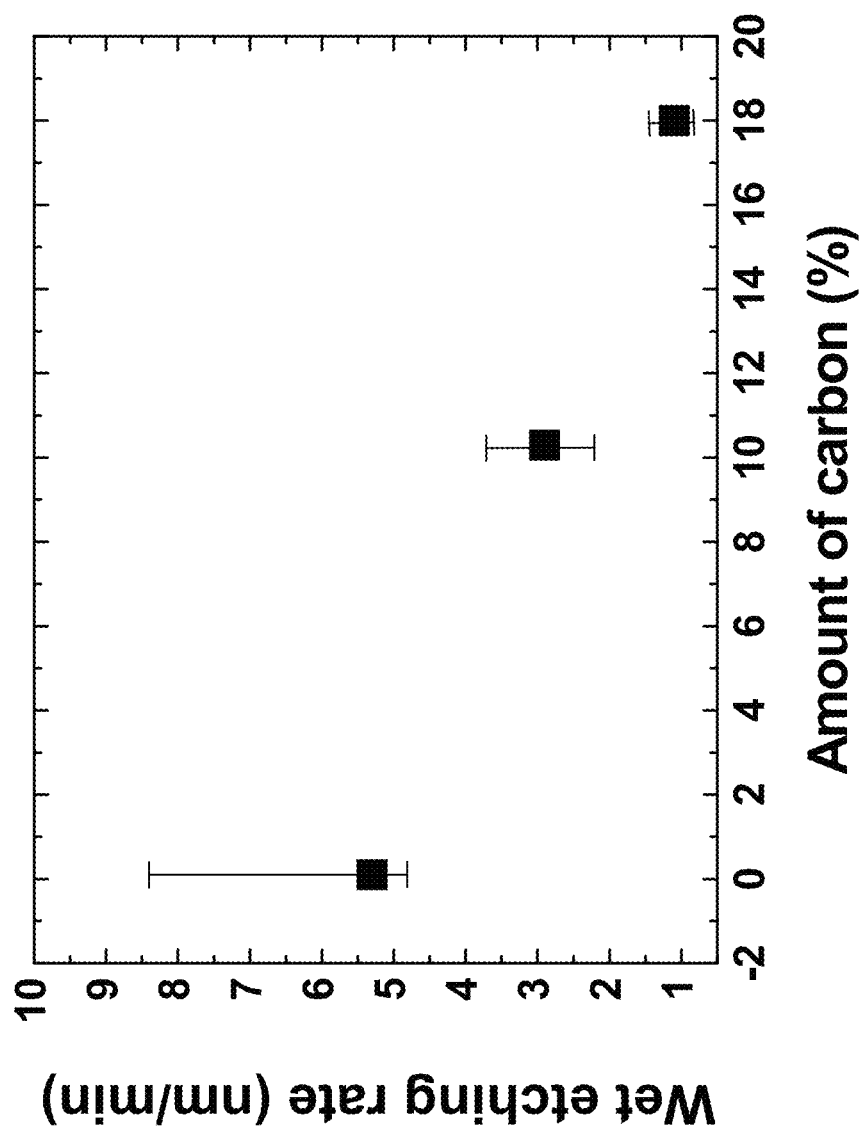
FIG. 11 is a graph showing the relationship between hydrocarbon amount of a dielectric layer and wet etching rate thereof according to embodiments of the present invention.

FIG. 11 shows the relationship between wet etching rate and amount of carbon of the deposited film. The etching test was carried out using a BHF130 etchant. The deposited film (SiN) on the Si substrate was dipped in the BHF130 etchant for 5 min, and then rinsed with de-ionized water. Film thickness was measured by an Ellipsometer. As shown in FIG. 5, by adjusting the amount of carbon, the wet etching rate can be controlled. The amount of carbon can be controlled by selecting a second precursor. In FIG. 5, the plots where the amount of carbon is about 0% were obtained from films formed according to Example 2a (no second precursor). The plots where the amount of carbon is about 10% were obtained from films formed according to Example 4

A significant advantage of the method of at least one of the disclosed embodiments of the present invention is that etch properties modified silicon nitride layers or other Si—N dielectric layers can be formed on semiconductor substrates using second precursors. The silicon nitride layers and other Si—N dielectric layers also may be formed at relatively low substrate temperatures and may be controlled the film composition, thereby increasing productivity without the occurrence of thermal damage to the substrate, and expanding the types of applicable substrates. In addition, the method of some embodiments of the present invention can control thickness exactly, and achieve high deposition rate, and can achieve high conformal structure.

The present invention further includes, but is not limited to, the following embodiments:

1) A method of forming a dielectric film having Si—N bonds on a semiconductor substrate by modified plasma enhanced atomic layer deposition (PEALD), which comprises: (a) introducing a nitrogen- and hydrogen-containing reactive gas and an rare gas into a reaction space inside which the semiconductor substrate is placed; (b) introducing a hydrogen-containing silicon precursor in pulses into the reaction space wherein the reactive gas and the rare gas are introduced; (c) performing RF plasma excitation in pulses immediately (e.g., 0~0.1 sec) after the silicon precursor is shut off; and (d) maintaining the introduction of the reactive gas and an rare gas as a purge. The above steps may be continuously repeated until the target thickness is obtained, thereby forming a dielectric film having Si—N bonds on the substrate.

2) The method according to 1), wherein the hydrogen-containing silicon precursor has a formula of Si$\alpha$H$\beta$X$\gamma$, wherein $\alpha$, $\beta$ and $\gamma$ are integers ($\gamma$ includes zero), X is N and/or CmHn wherein m and n are integers.

3) The method according to 1), wherein the substrate is kept at a temperature of 0° C. to 400° C. while the film is deposited thereon.

4) The method according to 1), wherein the hydrogen-containing silicon precursor is vaporized upstream of the reaction space.

5) The method according to 1), wherein the hydrogen-containing silicon precursor is introduced in pulses while the reactive gas and the rare gas are continuously introduced.

6) The method according to 1), wherein the hydrogen-containing silicon precursor is introduced in pulses with a duration of approximately 0.1 sec to 1.0 sec.

7) The method according to 1), wherein the RF plasma is excited in pulses with a duration of approximately 0.1 sec to 1.0 sec immediately (e.g., 0~0.1 sec) after the shutting off of the hydrogen-containing silicon precursor.

8) The method according to 1), wherein the reactive gas and the rare gas are maintained as a purge having a duration of approximately 0.5 to 2.0 sec after the end of supplying the silicon precursor in pulse and exciting the plasma in pulse.

9) The method according to 8), wherein the purge duration is equal to or longer than the plasma exciting duration.

10) The method according to 1), wherein the reactive gas is at least one of a mixture of N2 and H2, a mixture of NH3 and H2, and a nitrogen-boron-hydrogen gas.

11) The method according to 10), wherein the reactive gas is the mixture of N2 and H2 wherein a molar flow rate ratio of N2/H2 in the mixture is approximately 1/1 to 10/1.

12) The method according to 10), wherein the reactive gas is the mixture of NH3 and H2 wherein a molar flow rate ratio of NH3/H2 in the mixture is approximately 1/1 to 1/10.

13) The method according to 1), wherein the rare gas is at least a mixture of helium and argon.

14) The method according to 13), wherein the rare gas is solely a mixture of helium and argon wherein a molar flow rate ratio of helium/argon is approximately 1/1 to 20/1.

15) The method according to 1), wherein the RF plasma is applied in a range of approximately 0.02 W/cm2 to approximately 0.5 W/cm2 per area of the substrate and the reaction space pressure is adjusted in a range of approximately 0.1 Torr to approximately 10 Torr.

16) The method according to 1), wherein the forming dielectric film having Si—N bonds has a deposition rate of at least 0.1 nm/cycle.

17) The method according to 16), wherein the forming dielectric film having Si—N bonds has a step coverage or conformality of at least 90%.

18) The method according to 16), wherein the forming dielectric film having Si—N bonds has an etching rate lower than that of a thermal oxide film.

19) A method for modifying etch properties of a dielectric film having Si—N bonds on a semiconductor substrate by plasma enhanced atomic layer deposition (PEALD), which comprises: (a) introducing a reactive gas and a rare gas into a reaction chamber inside which a semiconductor substrate is placed; (b) introducing a carbon-free silicon precursor and a second precursor in pulses into the reaction space wherein a reactive gas and an rare gas are introduced; (c) exciting an RF plasma in pulses immediately after the carbon-free silicon precursor and the second precursor are shut off; (d) maintaining the reactive gas and the rare gas as a purge. The above steps may be continuously repeated until a target thickness is obtained, thereby forming an etch properties modifying dielectric film having Si—N bonds on the substrate.

20) The method according to 19), wherein the carbon-free silicon precursor has a formula of $Si_\alpha A_\beta B_\gamma$, wherein $\alpha$, $\beta$ and $\gamma$ are integers and y includes zero, A is H or Cl, and B is N.

21) The method according to 19), wherein the second precursor is selected form $NH_3$, $C_xH_y$, or a hydrocarbon-containing silicon precursor, where x and y are integers, x may be 1 to 8 and y may be 4 to 18.

22) The method according to 21), wherein the hydrocarbon-containing silicon precursor is selected and has a formula of $Si_aH_bX_c(C_mH_n)$ wherein a, b, and c are integers and c includes zero, and a is 1 to 5, b is 1 to 10, and c is 0 to 6. X is N, m and n are integers, and m is 2 to 18, n is 6 to 30.

23) The method according to 19), wherein the reactive gas is at least one of a mixture of N2 and H2, and a nitrogen-boron-hydrogen gas.

24) The method according to 23), wherein the reactive gas is the mixture of N2 and H2 wherein a molar flow rate ratio of N2/H2 in the mixture is approximately 1/1 to 10/1.

25) The method according to 19), wherein the rare gas is at least a mixture of helium and argon.

26) The method according to claim 25), wherein the rare gas is a mixture of helium and argon wherein a molar flow rate ratio of helium/argon is approximately 1/1 to 20/1.

27) The method according to 19), wherein the carbon-free silicon precursor and the second precursor are introduced in pulses having a duration of approximately 0.1 sec to 1.0 sec.

28) The method according to 19), wherein the RF plasma is excited in pulses having a duration of approximately 0.1 sec to 1.0 sec immediately (e.g., 0~0.1 sec) after the shutting off of the carbon-free silicon precursor and the second precursor.

29) The method according to 19), wherein the reactive gas and the rare gas are maintained as a purge with a duration of approximately 0.5 to 2.0 sec after the end of supplying the carbon-free silicon precursor and the second precursor in pulse and exciting the plasma in pulses.

30) The method according to claim 29), wherein the purge duration is equal to or longer than that of the plasma exciting duration.

31) The method according to 19), wherein the RF plasma is applied in a range of approximately 0.02 W/cm2 to approximately 0.5W/cm2 per area of the substrate and the reaction space pressure is adjusted in a range of approximately 0.1 Torr to approximately 10 Torr.

32) The method according to 19), wherein multiple dielectric films having Si—N bonds are formed each having different etching rates modified by the type of second precursor.

33) The method according to 32), wherein the etching rate is decreased by increasing the amount of carbon of the forming film having Si—N bonds.

34) The method according to 22), wherein the dielectric film having Si—N bonds has a step coverage or conformality of at least 90%.

35) The method according to 19), wherein the substrate is kept at a temperature of 300° C. to 600° C. while the film is deposited thereon.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. A method of forming a film on a semiconductor substrate by plasma enhanced atomic layer deposition (PEALD), which comprises:

selecting a combination of gases for forming a film by PEALD, said gases comprising a reactive gas, a rare gas, and a precursor, which are different from each other;

continuously introducing the reactive gas and the rare gas without interruption into a reaction space inside which the semiconductor substrate is placed;

introducing the precursor in pulses into the reaction space;

exciting an RF plasma in pulses in the reaction space, wherein each pulse of exciting the RF plasma starts immediately after each pulse of introducing the precursor, wherein one cycle is defined by one pulse of introducing the precursor with no pulse of exciting the RF plasma as a first period, one pulse of exciting the RF plasma with no pulse of introducing the precursor as a second period, and no pulse of introducing the precursor and no pulse of exciting the RF plasma as a third period; and forming a film on the substrate by repeating the cycle multiple times.

2. The method according to claim 1, wherein the precursor comprises Si, N, H, and optionally C in its molecule.

3. The method according to claim 2, wherein the precursor has a formula of Siα Hβ Xγ, wherein α and β are integers and γ is an integer including zero, X is N and/or CmHn wherein m and n are integers.

4. The method according to claim 1, wherein the precursor is a carbon-free precursor which is a first precursor, and the method further comprises introducing a second precursor in one cycle, wherein the second precursor is different from the first precursor and comprises a Si—N, C—H, or N—H bond in its molecule.

5. The method according to claim 4, wherein the second precursor has a formula of $Si_\alpha A_\beta B_\gamma$, wherein α, β and γ are integers and γ includes zero, A is H or Cl, and B is N.

6. The method according to claim 4, wherein the second precursor is selected from a hydrocarbon-containing silicon gas, a hydrocarbon gas, and an ammonium gas.

7. The method according to claim 6, wherein the hydrocarbon-containing silicon gas is selected and has a formula of $Si_a H_b N_c (C_m H_n)$ wherein a is an integer of 1 to 5, b is an integer of 1 to 10, and c is an integer of 0 to 6, m is an integer of 2 to 18, and n is an integer of 6 to 30.

8. The method according to claim 1, wherein the precursor is vaporized upstream of the reaction space.

9. The method according to claim 1, wherein the precursor is introduced in pulses of a duration of approximately 0.1 sec to 1.0 sec.

10. The method according to claim 1, wherein the excitation of the RF plasma is conducted in pulses of a duration of approximately 0.1 sec to 1.0 sec and starts 0 to 0.1 seconds after the shutting off of the precursor in each cycle.

11. The method according to claim 1, wherein the introduction of the reactive gas and the rare gas is maintained in each cycle as a purge for approximately 0.5 to 2.0 sec after the excitation of the PF plasma ends.

12. The method according to claim 11, wherein the duration of the purge is equal to or longer than the duration of the RF plasma excitation in one cycle.

13. The method according to claim 1, wherein the reactive gas is at least one of a mixture of $N_2$ and $H_2$, a mixture of $NH_3$ and $H_2$, and a nitrogen-boron-hydrogen gas.

14. The method according to claim 13, wherein the reactive gas is the mixture of $N_2$ and $H_2$ wherein a molar flow rate ratio of $N_2/H_2$ in the mixture is approximately 1/1 to 10/1.

15. The method according to claim 13, wherein the reactive gas is the mixture of $NH_3$ and $H_2$ wherein a molar flow rate ratio of $NH_3/H_2$ in the mixture is approximately 1/1 to 1/10.

16. The method according to claim 1, wherein the rare gas is at least a mixture of helium and argon.

17. The method according to claim 16, wherein the rare gas is a mixture of helium and argon wherein a molar flow rate ratio of helium/argon is approximately 1/1 to 20/1.

18. The method according to claim 1, wherein the film is deposited at a deposition rate of at least 0.1 nm/cycle.

19. The method according to claim 18, wherein the film has a step coverage or conformality of at least 90%.

20. The method according to claim 18, wherein the film has an etching rate lower than that of a thermal oxide film.

* * * * *